United States Patent
Fung

(12) 
(10) Patent No.: US 6,335,214 B1
(45) Date of Patent: Jan. 1, 2002

(54) SOI CIRCUIT WITH DUAL-GATE TRANSISTORS

(75) Inventor: Ka Hing Fung, Beacon, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/665,395

(22) Filed: Sep. 20, 2000

(51) Int. Cl.$^7$ .................................................. H01L 21/00
(52) U.S. Cl. .......................... 438/30; 438/197; 438/229; 438/257
(58) Field of Search .............................. 438/30, 197, 229, 438/257, 406, 459, 667, 928, 977; 257/66, 49, 67, 72, 40, 347

(56) References Cited

U.S. PATENT DOCUMENTS

| | | | | |
|---|---|---|---|---|
| 4,595,881 A | * | 6/1986 | Kennan | 330/54 |
| 5,252,842 A | * | 10/1993 | Buck et al. | 257/280 |
| 5,266,515 A | * | 11/1993 | Robb et al. | 437/56 |
| 5,807,783 A | * | 9/1998 | Gaul et al. | 438/406 |
| 5,892,246 A | * | 4/1999 | Tsai et al. | 257/66 |
| 5,917,210 A | * | 6/1999 | Huang et al. | 257/292 |
| 6,004,837 A | * | 12/1999 | Gambino et al. | 438/157 |
| 6,114,768 A | * | 9/2000 | Gaul et al. | 257/777 |
| 6,143,582 A | * | 11/2000 | Vu et al. | 438/30 |
| 6,228,691 B1 | * | 5/2001 | Doyle | 438/149 |

FOREIGN PATENT DOCUMENTS

| | | | | |
|---|---|---|---|---|
| JP | | 08340101 | * 6/1995 | 29/6 |

* cited by examiner

Primary Examiner—Charles Bowers
Assistant Examiner—Laura M Schillinger
(74) Attorney, Agent, or Firm—Eric W. Petraske

(57) ABSTRACT

A dual-gate SOI transistor that has the back gate self-aligned to the front gate is formed on an SOI substrate by forming a conventional gate stack having an etch resistant layer on the top; growing epitaxial silicon on the upper surface of the silicon device layer, which leaves apertures on both sides of the gate stack; filling the apertures with etch resistant spacers; defining an etch window bracketing the gate stack and etching alignment trenches down to the bulk silicon. A shallow layer of etch resistant aligning material is deposited on the bottom of the alignment trenches, after which the conventional back end processing as followed of deposition of a supporting layer that supports the layers of the circuit during later processing. The bulk silicon is removed and the back side is patterned to expose the buried oxide below the transistors; an oxide etch leaves a self-aligned backside aperture below the transistors, defined by the etch resistant aligning material. Deposition of a back-side spacer leaves a backside gate aperture that is filled by a metal gate.

7 Claims, 5 Drawing Sheets

SOI CIRCUIT WITH DUAL-GATE TRANSISTORS

FIELD OF THE INVENTION

The field of the invention is the formation of silicon insulator integrated circuits employing dual-gate technology.

BACKGROUND OF THE INVENTION

The advantages of dual-gate transistors in SOI processing (e.g. improved short-channel effects and higher current drive) are well known.

Production of satisfactory dual-gate transistors using conventional processing techniques has not been achieved and the dominant approach for deep sub-micron lithography has involved vertical transistors.

SUMMARY OF THE INVENTION

The invention relates to a method of forming a dual-gate transistor that employs conventional processing to provide a back side gate that is self-aligned to the upper gate.

A feature of the invention is the use of a transfer method to generate marking features on the wafer backside comprising the formation of etch stop spacers on the edge of a gate stack and the etching of an alignment trench through the silicon device layer and through the buried oxide layer, so that deposition of an alignment layer on the bottom of the alignment trench provides a marker on the backside.

Another feature of the invention is etching the backside between the backside markers to provide a self-aligned backside aperture aligned with respect to the gate stack.

DESCRIPTION OF THE PREFERRED EMBODIMENT

Figure 2:
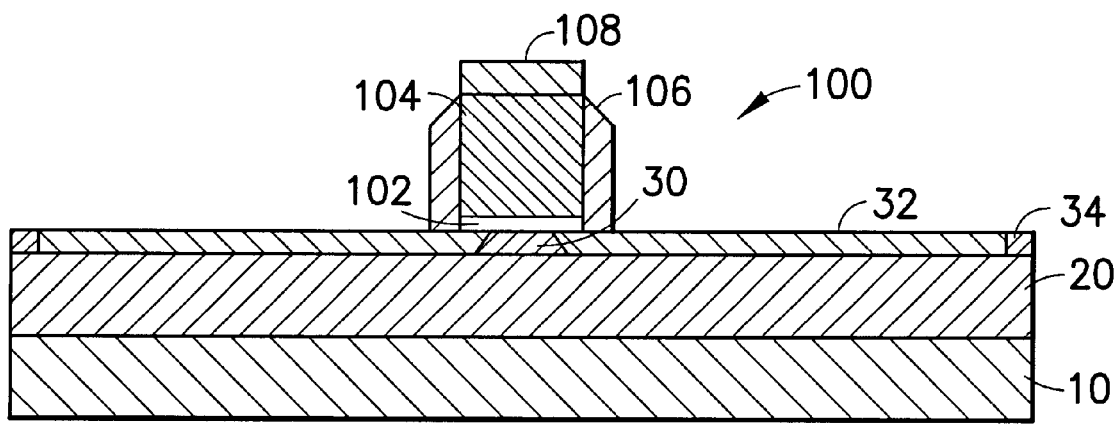
FIGS. 2 through 8 show intermediate steps in the process.

FIG. 2 shows a portion of an integrated circuit SOI wafer that contains a transistor 100. A conventional gate stack 104 (including at least a poly gate layer) is on top of front gate dielectric 102 that, in turn, is over a body formed in silicon device layer 30. A low-dose drain implant has been performed in the device layer (labelled with numeral 32) and nitride spacer sidewalls 106 have been formed (illustratively about 20 nm wide). Cap layer 108 is preferably performed of the same material (e.g. nitride) as spacers 106. The small blocks labelled 34 were underneath the defining resist layer when the low-dose implant was made. This block mask for this implant is used when N and P type devices are made on the same wafer.

Figure 3:
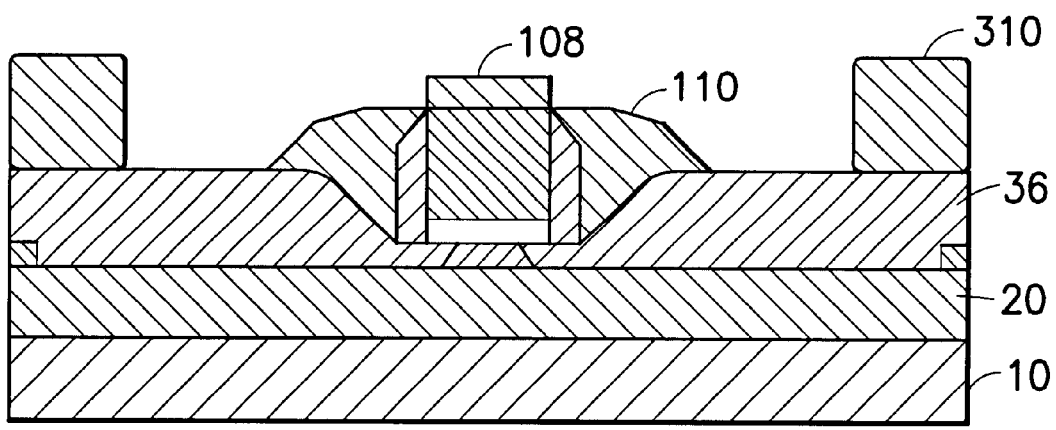

Next layer 32 has been thickened by selective epitaxial growth (or by deposition of polycrystalline silicon) to a thickness of 50–100 nm (layer 36). A conventional source-drain implant is formed after the epi growth. Since the selective growth leaves a tapering area, it is convenient to fill in an etch spacer, illustratively also of nitride, about 60 nm wide. A resist layer 310 is put down and patterned to define an aperture or etch window within which an etching step will take place. The etch windows are disposed about the gate stacks—i.e. the gate stacks are inside the etch windows. This front side etching aperture is aligned to be centered on the gate stack, though there will always be some alignment error. The result is shown in FIG. 3.

Those skilled in the art will appreciate that a thin SOI film is preferred to fabricate a good double-gate device. Such a thin film (less than about 20 nm for a 100 nm ground rule circuit) can improve the short channel effect and ensure the body to be fully depleted. With such a thin device layer, the thickening EPI process has the advantage of providing good contact resistance. The first spacer is used to allow selective EPI growth only on the SOI surface.

Figure 4:
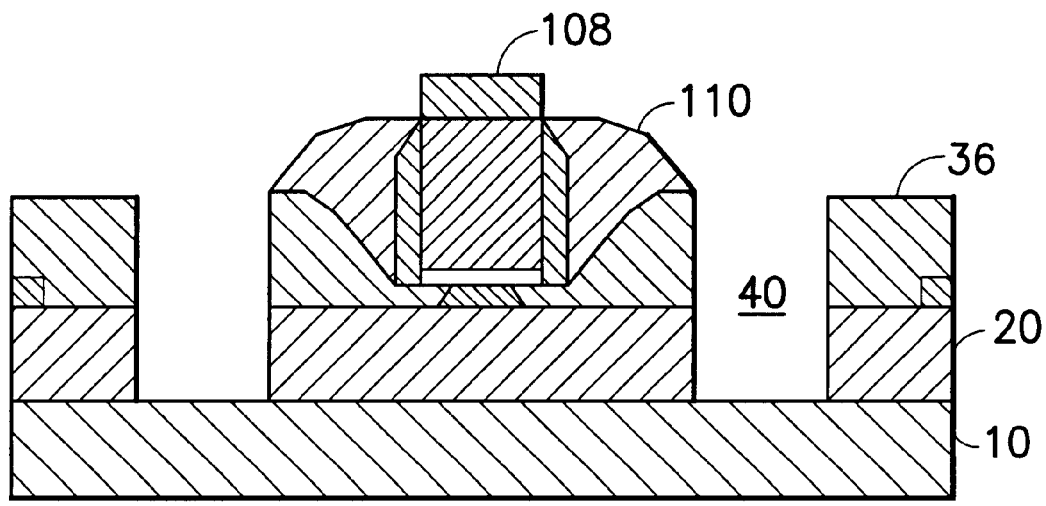

Referring now to FIG. 4, there is shown the result of two directional etching steps, selective to nitride, cutting through the silicon 36 and then through the oxide 20 to form alignment apertures 40, illustratively 20 nm wide. Since the gate stack is used as an etch stop during the etching process, the apertures 40 on either side are self-aligned to the gate stack-spacer combination, even though the gate stack will not in general be in the center of the etching aperture; i.e. one of apertures 40 will be wider than the other.

Figure 5:
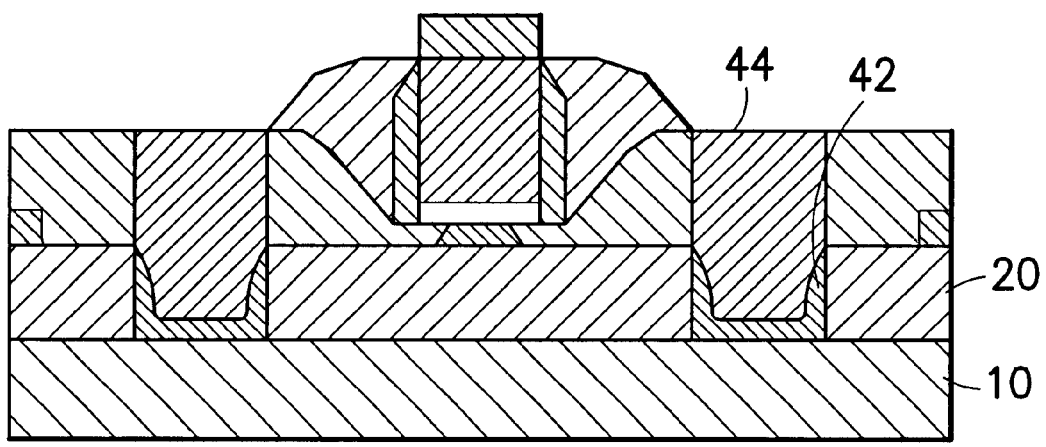
Figure 6:
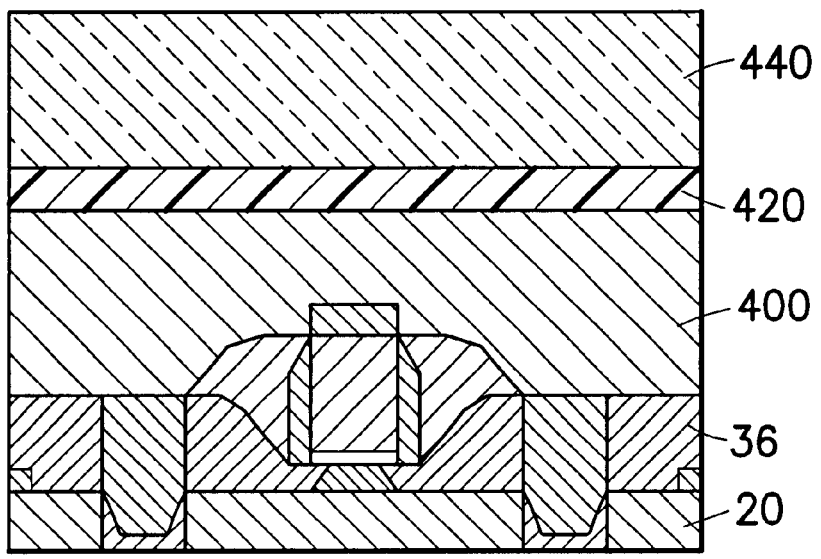

FIG. 5 shows the result of depositing a first etch-resistant alignment layer 42 (e.g. nitride) and then conductive layer 44 (e.g. poly) in aperture 40. As will be discussed below, layer 42 marks the boundary of the transistor area (left and right in the figures) and also serves to enable the opening of a self-aligned backside aperture centered on the gate stack (and therefore on the transistor body). The alignment apertures 40 and thus layer 42 extends in front of and behind the plane of the paper to surround transistor 100. Element 44 forms the contact portion of the transistor source and drain. Note that the extent of layer 42 in the vertical dimension is not important because element 44 makes contact with source/drain 35 over a large vertical area; i.e. it does not hurt if layer 42 is above the surface of oxide 20.

Next, the interconnections between transistors are formed (including through-contacts in apertures 40 to make contact to the backside gates that will be formed and the conventional back end processing) and the top surface of the wafer is attached to a support member 440 (glass plate 440) by any convenient adhesive (e.g. polyimide 420). Box 400 represents schematically the various interconnection elements, inter-layer dielectrics and the remaining transistors that make up the circuit, as well as the contact pads. After bonding, bulk silicon layer 10 is removed by grinding, etching and/or chemical-mechanical polishing.

With this backside process technique, multi-layout of metal interconnection can be formed on the backside as well. In the final circuit, the bonding pads can be put either on the frontside or the backside. If the bonding pads are on the frontside, handler 440 will be removed after all the processing. In this case, another substrate will be attached to the backside to offer mechanical support.

Figure 7:
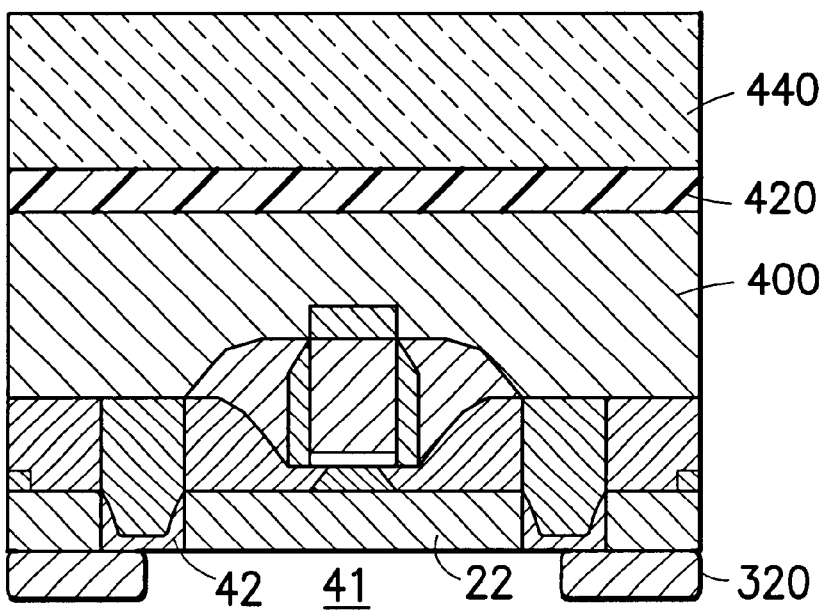

As is shown in FIG. 7, resist 320 is patterned to open an aperture 41 that ends on the bottom surfaces of alignment layers 42 and exposes buried oxide 22. The alignment will have errors, of course, but it is an advantageous feature of the invention that the inner edges of alignment layers 42 are self-aligned to the gate stack and therefore that the backside aperture that will be formed in the next step is self aligned to transistor body 30.

Figure 8:
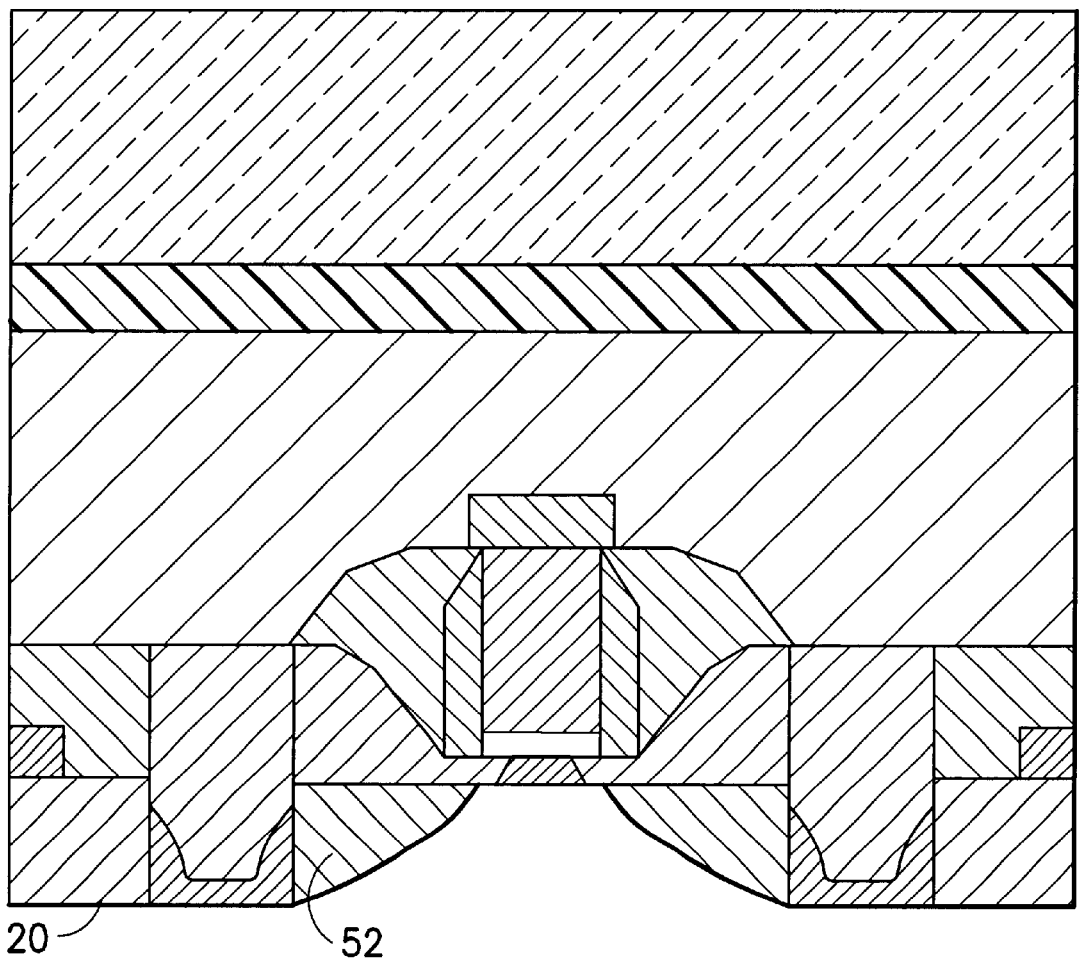

FIG. 8 shows the result of etching oxide 22 to form a backside aperture and depositing an insulating sidewall (e.g. nitride) to fill in the unneeded portion of the aperture. The width of spacers 52 is the sum of the widths of spacers 106 and 110 (e.g. 80 nm), so that the center opening is nominally the same width as body 30.

Figure 1:
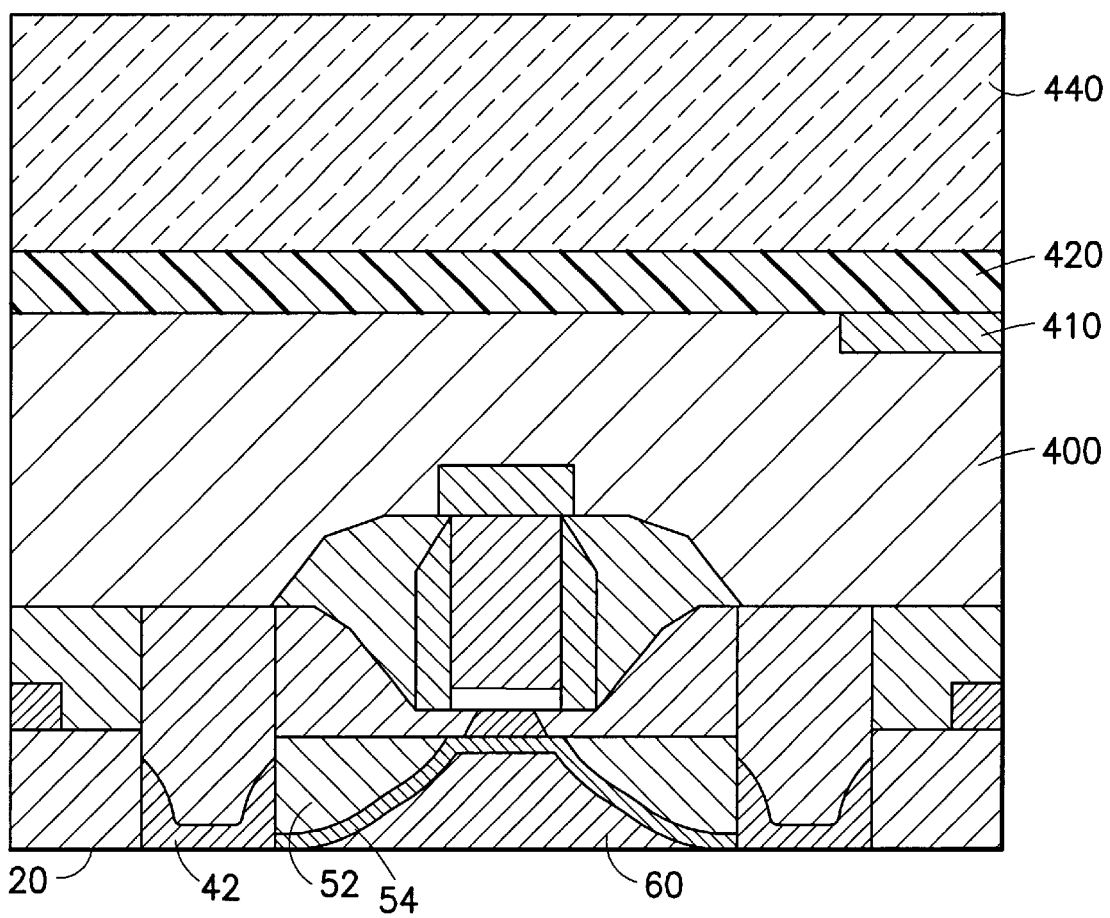
FIG. 1 shows a completed dual-gate transistor according to the invention.

Referring now to FIG. 1, there is shown the result, with an additional backside gate dielectric 54 and backside gate electrode 60. Illustratively, dielectric 54 is a high-k dielectric (e.g. aluminum oxide or zirconium oxide) and gate 60 is metal. The deposition of the backside dielectric should be at low temperature to prevent decomposition of the frontside metal. The material of gate 60 may be selected to apply a preferred backside gate threshold to the transistor. For example, using Tungsten will provide a backside gate threshold of about 0.5V. Conventional chemical-mechanical polishing removes the residue of these layers outside the backside aperture.

An additional step will form interconnect layers from backside gates 60 to the bottom of the structure and/or to connection elements that pass through the buried oxide to the interconnect 400.

Other materials that have the correct etch-resistant properties may be used in place of the examples given.

While the invention has been described in terms of a single preferred embodiment, those skilled in the art will recognize that the invention can be practiced in various versions within the spirit and scope of the following claims.

I claim:

1. A method of forming an integrated circuit having dual-gate transistors in an SOI semiconductor wafer having a device layer disposed above a buried insulator layer that in turn is disposed above a bulk substrate, comprising the steps of:

forming a set of transistor gate stacks on said device layer, each such gate stack being disposed over a transistor body;

forming etch resistant gate sidewalls and cap layers on said gate stacks;

forming a set of spacer sidewalls adjacent said gate sidewalls;

defining a set of etch windows disposed about said gate stacks;

etching a set of alignment apertures through said device layer and said buried insulator layer, said set of alignment apertures being disposed within said set of etch windows and adjacent to said spacer sidewalls;

depositing an alignment layer of etch-resistant material in the bottom of said alignment apertures;

depositing a layer of conductive material in said alignment apertures above said alignment layer and in contact with said semiconductor device layer;

forming interconnection members above said device layer to connect said set of transistors to define said integrated circuit;

bonding a top surface of said wafer to a support member;

removing said bulk substrate;

etching said buried insulator layer within a set of backside apertures below said set of transistors and defined by said alignment layers, thereby exposing a backside surface of said transistor body;

depositing a backside gate insulator layer on said backside surface of said transistor body; and depositing a backside gate conductor on said backside gate insulator layer.

2. A method according to claim 1, further comprising the steps of: increasing the thickness of said device layer about said spacer sidewalls; and depositing a set of etch spacers adjacent said spacer sidewalls.

3. A method according to claim 1, in which said step of increasing the thickness of said device layer is effected by selective epitaxial growth of said device layer.

4. A method according to claim 1, in which said step of increasing the thickness of said device layer is effected by deposition of conductive material on said device layer.

5. A method according to claim 1, further comprising the steps of:

forming a backside spacer within said backside aperture before said step of depositing said backside gate insulator, said backside spacer having a width such that said backside aperture only exposes a backside surface of said transistor body.

6. A method according to claim 2, further comprising the steps of:

forming a backside spacer within said backside aperture before said step of depositing said backside gate insulator, said backside spacer having a width such that said backside aperture only exposes a backside surface of said transistor body.

7. A method according to claim 3, further comprising the steps of:

forming a backside spacer within said backside aperture before said step of depositing said backside gate insulator, said backside spacer having a width such that said backside aperture only exposes a backside surface of said transistor body.

* * * * *